United States Patent
Aoyama

(10) Patent No.: US 8,127,259 B2
(45) Date of Patent: Feb. 28, 2012

(54) SYNTHESIS CONSTRAINT CREATING DEVICE, BEHAVIORAL SYNTHESIS DEVICE, SYNTHESIS CONSTRAINT CREATING METHOD AND RECORDING MEDIUM

(75) Inventor: Tetsuya Aoyama, Tokyo (JP)

(73) Assignee: NEC Corporation, Tokyo (JP)

( * ) Notice: Subject to any disclaimer, the term of this patent is extended or adjusted under 35 U.S.C. 154(b) by 413 days.

(21) Appl. No.: 12/399,326

(22) Filed: Mar. 6, 2009

(65) Prior Publication Data
US 2009/0228859 A1 Sep. 10, 2009

(30) Foreign Application Priority Data
Mar. 6, 2008 (JP) .................................. 2008-056173

(51) Int. Cl.
G06F 9/45 (2006.01)
(52) U.S. Cl. ........ 716/103; 716/104; 716/106; 716/108; 703/13; 703/14
(58) Field of Classification Search .......... 716/103–104, 716/106–107; 703/13–14
See application file for complete search history.

(56) References Cited

U.S. PATENT DOCUMENTS

| | | | | |
|---|---|---|---|---|
| 7,318,213 | B2 * | 1/2008 | Nishi ............................ | 716/103 |
| 7,840,931 | B2 * | 11/2010 | Gutberlet et al. ............. | 716/104 |
| 7,882,483 | B2 * | 2/2011 | Gangadharan et al. ....... | 716/106 |
| 2006/0225022 | A1 * | 10/2006 | Ezaki ............................. | 716/18 |
| 2007/0083844 | A1 * | 4/2007 | Kabuo et al. .................. | 716/18 |
| 2009/0228859 | A1 * | 9/2009 | Aoyama ........................ | 716/18 |

FOREIGN PATENT DOCUMENTS

JP 2006285865 A 10/2006

* cited by examiner

*Primary Examiner* — Nghia Doan

(57) ABSTRACT

A synthesis constraint creating unit has a process emergence number acquiring unit that acquires, for each process attribute, the emergence number of the process belonging to each process attribute, the process being in the behavior level description, a circuit structure component specifying unit that specifies a kind of a circuit structural component which can embody the process belonging to each process attribute and which can be described in a register transfer level description, for each process attribute, and a synthesis constraint creating unit that creates synthesis constraint information indicating the kind and number of circuit structural component necessary for expressing the process described in the behavior level description by the register transfer level description based on the emergence number of the process acquired for each process attribute and the kind of the circuit structural component specified for each process attribute.

12 Claims, 10 Drawing Sheets

BEHAVIOR LEVEL DESCRIPTION

```
sc_uint<3> i;
sc_uint<4> a0, a1;
sc_uint<5> b0, b1;
sc_uint<6> c0, c1;
sc_uint<7> d0, d1;
sc_uint<8> x[5];

void main()
{
    for (i = 4 ; i > 0; i--) {        ⎫
        x[i] = x[i-1] + i ;           ⎬ A1
    }                                 ⎭ b0 = a0 + a1;     ◄──── B5
    c0 = b0 + b1;     ◄──── B6
    d0 = c0 + c1;     ◄──── B7
    e0 = d0 + d1;     ◄──── B8
}
```
201

OPTIMIZATION IN LANGUAGE LEVEL ⟹

BEHAVIOR LEVEL DESCRIPTION HAVING UNDERGONE LANGUAGE LEVEL OPTIMIZATION

```
sc_uint<3> i;
sc_uint<4> a0, a1;
sc_uint<5> b0, b1;
sc_uint<6> c0, c1;
sc_uint<7> d0, d1;
sc_uint<8> x[5];

void main()
{
    x[4] = x[3] + 4 ;     ◄──── B1
    x[3] = x[2] + 3 ;     ◄──── B2
    x[2] = x[1] + 2 ;     ◄──── B3
    x[1] = x[0] + 1 ;     ◄──── B4 b0 = a0 + a1;         ◄──── B5
    c0 = b0 + b1;         ◄──── B6
    d0 = c0 + c1;         ◄──── B7
    e0 = d0 + d1;         ◄──── B8
}
```
202

FIG. 2

BEHAVIOR LEVEL DESCRIPTION

```
sc_uint<3> i;
sc_uint<4> a0, a1;
sc_uint<5> b0, b1;
sc_uint<6> c0, c1;
sc_uint<7> d0, d1;
sc_uint<8> x[5];

void main()
{
    for (i = 4 ; i > 0; i--) {      ⎫
        x[i] = x[i-1] + i ;          ⎬ A1
    }                                ⎭
    b0 = a0 + a1;      ← B5
    c0 = b0 + b1;      ← B6
    d0 = c0 + c1;      ← B7
    e0 = d0 + d1;      ← B8
}
```
~201

OPTIMIZATION IN LANGUAGE LEVEL ⇑

BEHAVIOR LEVEL DESCRIPTION HAVING UNDERGONE LANGUAGE LEVEL OPTIMIZATION

```
sc_uint<3> i;
sc_uint<4> a0, a1;
sc_uint<5> b0, b1;
sc_uint<6> c0, c1;
sc_uint<7> d0, d1;
sc_uint<8> x[5];

void main()
{
    x[4] = x[3] + 4 ;    ← B1
    x[3] = x[2] + 3 ;    ← B2
    x[2] = x[1] + 2 ;    ← B3
    x[1] = x[0] + 1 ;    ← B4 b0 = a0 + a1;        ← B5
    c0 = b0 + b1;        ← B6
    d0 = c0 + c1;        ← B7
    e0 = d0 + d1;        ← B8
}
```
~202

FIG. 5

BEHAVIOR LEVEL DESCRIPTION
HAVING UNDERGONE LANGUAGE LEVEL OPTIMIZATION

```
sc_uint<8>   a0, a1, t0;
sc_uint<8>   b0, b1, t1;
sc_uint<16>  c0, c1, t2;
sc_int<16>   d0, d1, t3;
void main{}
{
    t0 = a0 + a1;
    t1 = b0 - b1;
    t2 = c0 + c1;
    t3 = d0 + d1; }
```

502

LIBRARY INFORMATION STORING AREA

| KIND OF FUNCTIONAL UNIT | BIT WIDTH | SIGN |
|---|---|---|
| ADDER | 8 | unsigned |
| SUBTRACTER | 8 | unsigned |
| ADDER-SUBTRACTER | 8 | unsigned |
| ADDER | 16 | unsigned |
| ADDER | 16 | signed |
| ADDER | 16 | signed unsigned |

501

PER-PROCESS KIND STORING AREA

| PROCESS ATTRIBUTE | | | EMERGENCE NUMBER |
|---|---|---|---|
| KIND OF PROCESS | BIT WIDTH | SIGN | |
| + (ADDITION) | 8 | unsigned | 1 |
| − (SUBTRACTION) | 8 | unsigned | 1 |
| + (ADDITION) | 16 | unsigned | 1 |
| + (ADDITION) | 16 | signed | 1 |

503

WHEN PRIORITY IS GIVEN TO AREA

504 SYNTHESIS CONSTRAINT INFORMATION

| KIND OF FUNCTIONAL UNIT | BIT WIDTH | SIGN | NUMBER |
|---|---|---|---|
| ADDER-SUBTRACTER | 8 | unsigned | 1 |
| ADDER | 16 | signed unsigned | 1 |

WHEN PRIORITY IS GIVEN TO DELAY TIME

505 SYNTHESIS CONSTRAINT INFORMATION

| KIND OF FUNCTIONAL UNIT | BIT WIDTH | SIGN | NUMBER |
|---|---|---|---|
| ADDER | 8 | unsigned | 1 |
| SUBTRACTER | 8 | unsigned | 1 |
| ADDER | 16 | unsigned | 1 |
| ADDER | 16 | signed | 1 |

| IMPLEMENTING METHOD OF ADDITION AND SUBTRACTION PROCESS ||
|---|---|
| WHEN EXCLUSIVE FUNCTIONAL UNIT IS USED | WHEN ADDER-SUBTRACTER IS USED |
| AREA : LARGE | AREA : SMALL |
| DELAY TIME : SMALL | DELAY TIME : LARGE |

602

| IMPLEMENTING METHOD OF SIGNED/UNSIGNED COMPUTATION ||
|---|---|
| WHEN EXCLUSIVE FUNCTIONAL UNIT IS USED | WHEN MIXED-SIGN FUNCTIONAL UNIT IS USED |
| AREA : LARGE | AREA : SMALL |
| DELAY TIME : SMALL | DELAY TIME : LARGE |

FIG. 8

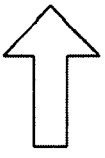

OPTIMIZATION IN LANGUAGE LEVEL

801 BEHAVIOR LEVEL DESCRIPTION

```
sc_uint<4> a0, a1, a2, a3;
sc_uint<4> b0, b1, b2, b3;
sc_uint<4> t0, t1, t2, t3;
sc_uint<8> a[4], b[4], c[4];

void main()
{
    t0 = a0 + a1;              ← C1
    t1 = func(b0, b1);         ← C2
    t2 = a2 + a3;              ← C3
    for (i=0; i < 4; i++) {    ⎫
        a[i] = b[i] + c[i];    ⎬ C4
    }                          ⎭
    t3 = func(b2, b3);         ← C5
} sc_uint<4> func (sc_uint<4> x,   ⎫
                 sc_uint<4> y)    ⎬ C6
{                                 ⎪
    sc_uint<4> z;                 ⎪
    z = x - y;                    ⎪
    return z;                     ⎭
}
```

802 BEHAVIOR LEVEL DESCRIPTION HAVING UNDERGONE LANGUAGE LEVEL OPTIMIZATION

```
sc_uint<4> a0, a1, a2, a3;
sc_uint<4> b0, b1, b2, b3;
sc_uint<4> t0, t1, t2, t3;
sc_uint<8> a[4], b[4], c[4];

void main()
{
    t0 = a0 + a1;              ← D1
    x_0 = b0;                  ⎫
    y_0 = b1;                  ⎬ D2(ISSUE ID02)
    t1 = x_0 - y_0;            ⎭
    t2 = a2 + a3;              ← D3  (ISSUE ID01)
    a[0] = b[0] + c[0];        ← D4
    a[1] = b[1] + c[1];        ← D5
    a[2] = b[2] + c[2];        ← D6
    a[3] = b[3] + c[3];        ← D7
    x_1 = b2;                  ⎫
    y_1 = b3;                  ⎬ D8(ISSUE ID02)
    t3 = x_1 - y_1;            ⎭
}
```

FIG. 10

LIBRARY INFORMATION STORING AREA

| KIND OF FUNCTIONAL UNIT | BIT WIDTH | SIGN |
|---|---|---|
| ADDER | 4 | unsigned |
| ADDER | 8 | unsigned |
| SUBTRACTER | 4 | unsigned |

1001

PER-AFFILIATION PROCESS NUMBER STORING AREA

| PROCESS ATTRIBUTE ||| AFFILIATION ATTRIBUTE | EMERGENCE NUMBER |
|---|---|---|---|---|
| KIND OF PROCESS | BIT WIDTH | SIGN | | |
| + (ADDITION) | 4 | unsigned | NULLITY | 2 |
| + (ADDITION) | 8 | unsigned | LOOP (ID01) | 4 |
| − (SUBTRACTION) | 4 | unsigned | FUNCTION (ID02) | 2 |

1002

LANGUAGE-LEVEL-OPTIMIZATION IMPLEMENTING METHOD STORING AREA

| ID | OPTIMIZATION IMPLEMENTING METHOD SPECIFYING INFORMATION |
|---|---|
| O1 | UNROLLING OF LOOP (REPEAT NUMBER: 4) |
| O2 | INLINE EXPANSION OF FUNCTION (CALLING NUMBER: 2) |

1003

SPECIFY THAT RATE OF PRIORITY BETWEEN AREA PRIORITIZATION AND DELAY TIME PRIORITIZATION BECOMES 1:1

SYNTHESIS CONSTRAINT INFORMATION

| KIND OF FUNCTIONAL UNIT | BIT WIDTH | SIGN | NUMBER |
|---|---|---|---|
| ADDER | 4 | unsigned | 1 |
| ADDER | 8 | unsigned | 2 |
| SUBTRACTER | 4 | unsigned | 1 |

1004

SYNTHESIS CONSTRAINT CREATING DEVICE, BEHAVIORAL SYNTHESIS DEVICE, SYNTHESIS CONSTRAINT CREATING METHOD AND RECORDING MEDIUM

This application is based on Japanese Patent Application No. 2008-056173 filed on Mar. 6, 2008 and including specification, claims, drawings and summary. The disclosure of the above Japanese Patent Application is incorporated herein by reference in its entirety.

BACKGROUND OF THE INVENTION

1. Field of the Invention

The present invention relates to a synthesis constraint creating device, a behavioral synthesis device, a synthesis constraint creating method and a recording medium for creating synthesis constraint information indicating a constraint which must be satisfied when a behavioral synthesis device creates a register transfer level description from a behavior level description.

2. Description of the Related Art

Presently, there is known a behavioral synthesis technology of creating a register transfer level description (RTL description) from a behavior level circuit description (behavior level description) to support designing of a semiconductor integrated circuit, such as an LSI or a VLSI. There are also known various kinds of technologies for reducing the burden of a designer in behavioral synthesis. For example, Unexamined Japanese Patent Application KOKAI Publication No. 2006-285865 (hereinafter, "patent literature 1") discloses a technology of facilitating a work for establishing a correspondence relationship between an RTL description and a behavior level description.

According to the technology disclosed in patent literature 1, it is necessary for the designer or the like of a circuit to prepare information (hereinafter, "synthesis constraint information") indicating a constraint like the number of components of a circuit beforehand in executing a behavioral synthesis process.

However, preparation of synthesis constraint information beforehand is very difficult. This is because synthesis constraint information to be prepared must be information corresponding to a library containing various kinds of circuit information for a circuit to be designed. Another reason is that if a behavioral synthesis scheme applied to a behavior level description differs, most appropriate synthesis constraint information to be prepared becomes different.

The present invention has been made in view of the foregoing circumstances, and it is an object of the present invention to provide a synthesis constraint creating device, a behavioral synthesis device, a synthesis constraint creating method and a recording medium for creating synthesis constraint information indicating a constraint which must be satisfied when a behavioral synthesis device creates a register transfer level description from a behavior level description.

SUMMARY OF THE INVENTION

To achieve the object, a synthesis constraint creating device according to the first aspect of the present invention creates synthesis constraint information indicating a constraint which must be satisfied when a behavioral synthesis device creates a register transfer level description from a behavior level description, the synthesis constraint creating device comprising:

a process emergence number acquiring unit that classifies a process described in the behavior level description in accordance with a process attribute, and acquires, for each process attribute, an emergence number of a process belonging to each process attribute, the process being in the behavior level description;

a circuit structural component specifying unit that specifies, for each process attribute, a kind of a circuit structural component which can embody a process belonging to each process attribute and which can be described in the register transfer level description based on library information specifying circuit structural components which can be described in the register transfer level description; and a synthesis constraint information creating unit that creates synthesis constraint information indicating a kind and a number of a circuit structural component necessary for expressing a process described in the behavior level description by the register transfer level description based on the emergence number of a process acquired by the process emergence number acquiring unit for each process attribute, and the kind of a circuit structural component specified by the circuit structural component specifying unit for each process attribute.

To achieve the object, a behavioral synthesis device according to the second aspect of the present invention comprises:

a process emergence number acquiring unit that classifies a process described in a behavior level description in accordance with a process attribute, and acquires, for each process attribute, an emergence number of a process belonging to each process attribute, the process being in the behavior level description;

a circuit structural component specifying unit that specifies, for each process attribute, a kind of a circuit structural component which can embody a process belonging to each process attribute and which can be described in a register transfer level description based on library information specifying circuit structural component which can be described in the register transfer level description;

a synthesis constraint information creating unit that creates synthesis constraint information indicating a kind and a number of a circuit structural component necessary for expressing a process described in the behavior level description by the register transfer level description based on the emergence number of a process acquired for each process attribute by the process emergence number acquiring unit and the kind of a circuit structural component specified for each process attribute by the circuit structural component specifying unit; and a behavioral synthesis unit that creates the register transfer level description from the behavior level description with a constraint indicated by the synthesis constraint information created by the synthesis constraint information creating unit being satisfied.

To achieve the object, a synthesis constraint creating method according to the third aspect of the present invention is executed by a synthesis constraint creating device that creates synthesis constraint information indicating a constraint which must be satisfied when a behavioral synthesis device creates a register transfer level description from a behavior level description, the device comprising a process emergence number acquiring unit, a circuit structural component specifying unit, and a synthesis constraint information creating unit, and the method comprising:

a process emergence number acquiring step in which the process emergence number acquiring unit classifies a process described in the behavior level description in accordance with a process attribute, and acquires, for each process attribute, an emergence number of a process belonging to each process attribute, the process being in the behavior level description;

a circuit structural component specifying step in which the circuit structural component specifying unit specifies, for each process attribute, a kind of a circuit structural component which can embody a process belonging to each process attribute and which can be described in the register transfer level description based on library information for specifying circuit structural components which can be described in the register transfer level description; and a synthesis constraint information creating step in which the synthesis constraint information creating unit creates synthesis constraint information indicating a kind and a number of a circuit structural component necessary for expressing a process described in the behavior level description by the register transfer level description based on the emergence number of a process acquired by the process emergence number acquiring unit for each process attribute, and the kind of a circuit structural component specified by the circuit structural component specifying unit for each process attribute.

To achieve the object, a recording medium according to the fourth aspect of the present invention records a program allowing a computer to function as a synthesis constraint creating device that creates synthesis constraint information indicating a constraint which must be satisfied when a behavioral synthesis device creates a register transfer level description from a behavior level description, and wherein the synthesis constraint creating device comprising:

a process emergence number acquiring unit that classifies a process described in the behavior level description in accordance with a process attribute, and acquires, for each process attribute, an emergence number of a process belonging to each process attribute, the process being in the behavior level description;

a circuit structural component specifying unit that specifies, for each process attribute, a kind of a circuit structural component which can embody a process belonging to each process attribute and which can be described in the register transfer level description based on library information specifying circuit structural components which can be described in the register transfer level description; and a synthesis constraint information creating unit that creates synthesis constraint information indicating a kind and a number of a circuit structural component necessary for expressing a process described in the behavior level description by the register transfer level description based on the emergence number of a process acquired by the process emergence number acquiring unit for each process attribute, and the kind of a circuit structural component specified by the circuit structural component specifying unit for each process attribute.

According to the present invention, it becomes possible to create synthesis constraint information indicating a constraint which must be satisfied when a behavioral synthesis device creates a register transfer level description from a behavior level description.

BRIEF DESCRIPTION OF THE DRAWINGS

The object and other objects and advantages of the present invention will become more apparent upon reading of the following detailed description and the accompanying drawings in which:

FIG. 2 is a diagram for explaining a scheme of optimizing a behavior level description in a language level according to the first embodiment of the present invention;

FIG. 5 is a diagram for explaining a process of creating synthesis constraint information using synthesis instruction information in detail according to the first embodiment of the present invention;

FIG. 6 is a diagram for explaining differences in areas and delay times depending on the kind of a functional unit;

FIG. 8 is a diagram for explaining a scheme of optimizing a behavior level description in a language level according to the second embodiment of the present invention;

FIG. 10 is a diagram for explaining a process of creating synthesis constraint information in detail according to the second embodiment of the present invention.

DETAILED DESCRIPTION OF THE PREFERRED EMBODIMENTS

An explanation will be given of a behavioral synthesis device 100 according to the embodiments of the present invention with reference to accompanying drawings. The behavioral synthesis device 100 performs behavioral synthesis on a description (hereinafter, "behavior level description") expressing a circuit like a semiconductor integrated circuit in a behavior level, thereby outputting a description (hereinafter, "register transfer level description" or "RT level description" or "RTL description") expressing such a circuit in a register transfer level. The behavioral synthesis device 100 automatically creates synthesis constraint information indicating a constraint which must be satisfied when creating a register transfer level description from a behavior level description prior to behavioral synthesis. That is, the behavioral synthesis device 100 has a function as a behavioral synthesis device and a function as a synthesis constraint creating device for creating synthesis constraint information. Accordingly, when a designer carries out behavioral synthesis using the behavioral synthesis device 100, it is possible for the designer to save a step of manually creating synthesis constraint information prior to behavioral synthesis. Note that the designer may create new synthesis constraint information based on synthesis constraint information automatically created by the behavioral synthesis device 100, may give the newly-created synthesis constraint information to the behavioral synthesis device 100 to cause the behavioral synthesis device 100 to perform behavioral synthesis.

The embodiments of the present invention are for facilitating understanding of the principle of the present invention, and the scope of the present invention should not be limited to the following embodiments. Accordingly, it should be understood that another embodiment in which a person skilled in the art appropriately substitute an equivalent for the structural component of the following embodiments is within the scope of the present invention.

First Embodiment

Figure 1:
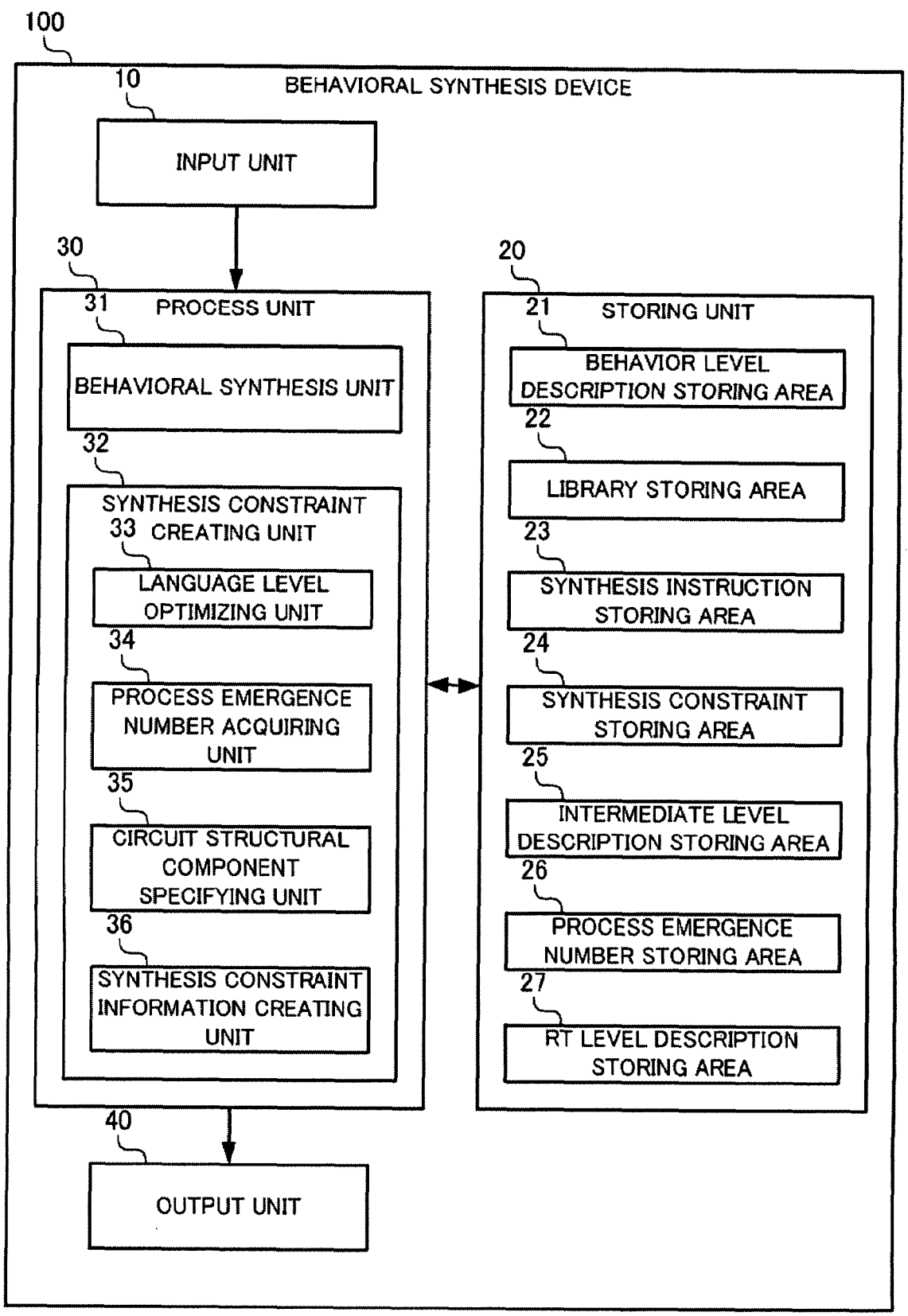
FIG. 1 is a block diagram showing the structure of a behavioral synthesis device according to the first embodiment of the present invention.

As shown in FIG. 1, the behavioral synthesis device 100 of the first embodiment has an input unit 10, a storing unit 20, a process unit 30, and an output unit 40.

The input unit 10 comprises a keyboard, a mouse, and the like. The input unit 10 supplies synthesis instruction information for instructing behavioral synthesis through a scheme input by a user and a behavior level description created by the user to the process unit 30.

The storing unit 20 comprises a storing device like a hard disk drive, stores an operating program to be executed by the process unit 30 and stores various kinds of data necessary for embodying the present invention. In the embodiment, the storing unit 20 has storing areas, such as a behavior level description storing area 21, a library storing area 22, a synthesis instruction storing area 23, a synthesis constraint storing area 24, an intermediate level description storing area 25, a process emergence number storing area 26, and an RT level description storing area 27 thereinside, and each storing area stores predetermined data.

The behavior level description storing area 21 stores a behavior level description. FIG. 2 shows a description 201 which is an example of a behavior level description described in System C.

Returning to FIG. 1, the library storing area 22 registers information on circuit structural components, such as a functional unit, a memory, an input/output terminal, a multiplexer, a register, a decoder, a logic operation, and a constant table, as library information. It is necessary that an RTL description of a semiconductor integrated circuit must be composed of a circuit structural component registered in the library storing area 22.

Figure 3:
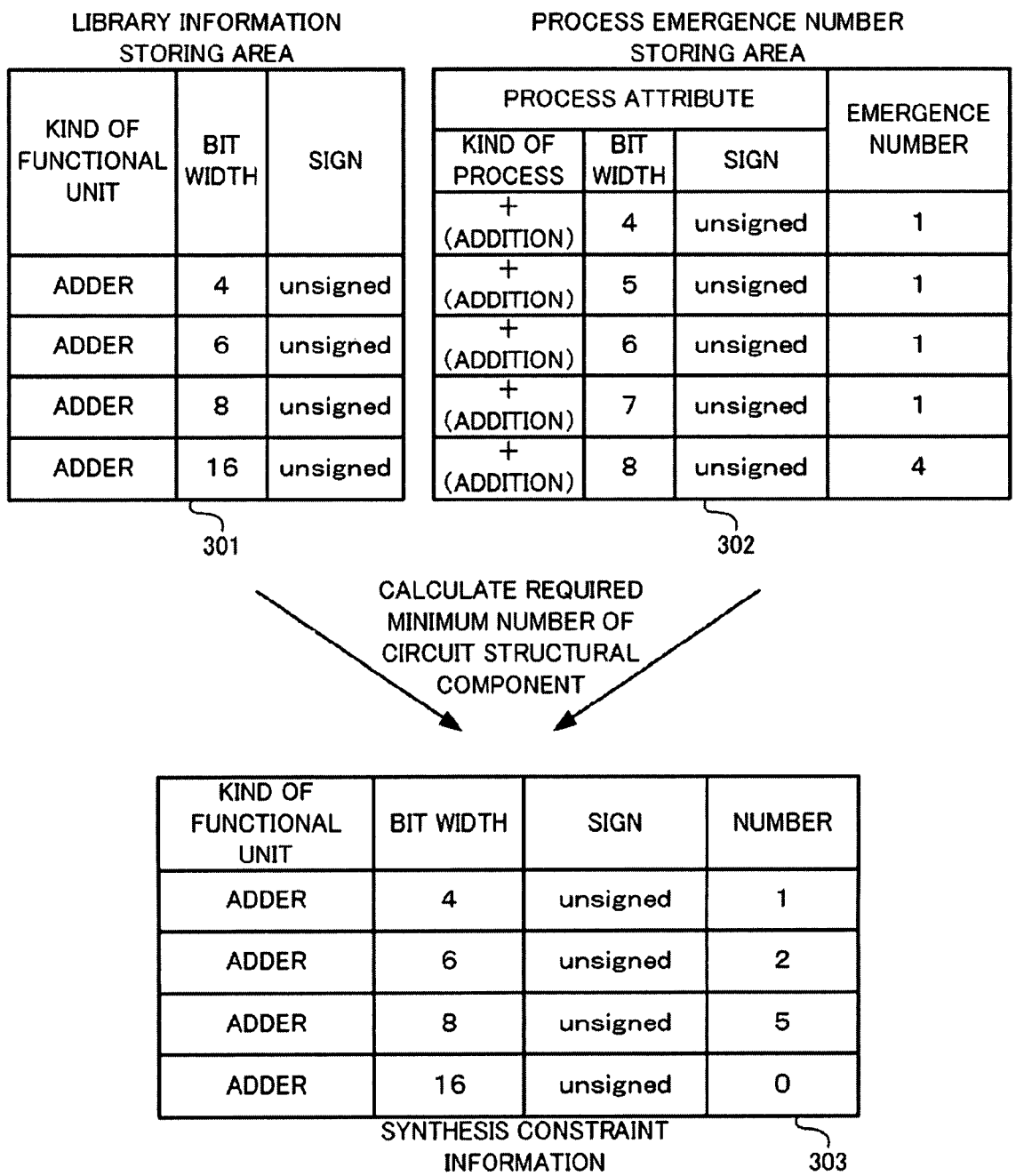
FIG. 3 is a diagram for explaining a process of creating synthesis constraint information in detail according to the first embodiment of the present invention.

FIG. 3 shows a table 301 exemplarily showing an example of library information that is related to a functional unit that serves as a circuit structural component and stored in the library storing area 22. In this example, four kinds of adders having bit widths of 4, 6, 8, and 16 bit and having a sign unsigned are registered in the library storing area 22 as library information. That is, when an adder is disposed in an RTL description based on this library information, it is not possible to dispose an adder other than those four kinds of adders.

Returning to FIG. 1, the synthesis instruction storing area 23 stores information (hereinafter, "synthesis instruction information") which is given by the designer or the like in a behavioral synthesis process and which is for instructing a creation scheme of synthesis constraint information. Examples of such synthesis instruction information are information which affects a circuit to be synthesized entirely and information which affects a circuit to be synthesized partially. An example of information affecting a circuit to be synthesized entirely is information of instructing behavioral synthesis taking a priority for an area or a delay time. An example of information affecting a circuit to be synthesized partially is information of instructing to process a specific control statement or variable, etc. in a behavior level description under a desired condition. Such synthesis instruction information is stored in the synthesis instruction storing area 23.

It is necessary that the foregoing behavior level description, library information and synthesis instruction information must be created by the circuit designer or the like beforehand prior to a behavioral synthesis process, and must be stored in respective areas.

The synthesis constraint storing area 24 stores synthesis constraint information necessary when an RT level description is created in a behavioral synthesis process. The synthesis constraint information indicates a constraint, such as the kind of a circuit structural component like a functional unit or a register, and the number thereof. The synthesis constraint information is not prepared by the user beforehand, but is created through a synthesis constraint creating process to be discussed later.

The intermediate level description storing area 25 stores a description (hereinafter, "intermediate level description") created at each step of behavioral synthesis. The intermediate level description storing area 25 also stores a behavior level description optimized in a language level through the synthesis constraint creating process to be discussed later.

The process emergence number storing area 26 stores the emergence number of each process in a behavior level description. The emergence number is stored for each attribute of a process (hereinafter, "process attribute"). FIG. 3 shows a table 302 exemplarily showing an example of information stored in the process emergence number storing area 26.

Returning to FIG. 1, the RT level description storing area 27 stores a register transfer level description eventually created from a behavior level description through a behavioral synthesis process.

The process unit 30 comprises a CPU (Central Processing Unit), a ROM (Read Only Memory), a RAM (Random Access Memory) and the like. The process unit 30 uses the RAM as a work area, and executes the operating program stored in the ROM or the storing unit 20, thereby controlling the operation of the behavioral synthesis device 100.

The process unit 30 functionally has a behavioral synthesis unit 31 and a synthesis constraint creating unit 32.

The behavioral synthesis unit 31 executes a behavioral synthesis process of creating an RT level description from a behavior level description on the basis of the library information stored in the library storing area 22 and the synthesis instruction information stored in the synthesis instruction storing area 23. The behavioral synthesis process includes a language level optimizing step, a scheduling step, a resource allocation step, a binding step, and another optimizing step, etc.

The language level optimizing step is for performing optimization, such as resolution of a function calling (inline expansion), unroll of a loop, and deletion of an unnecessary code, on a behavior level description in a language level. That is, the language level optimizing step is a step of optimizing a behavior level description in a description level.

The scheduling step is for extracting a flow of a control and data from an optimized behavior level description, and for determining what process, computation and the like should be executed in which step (or condition).

The resource allocation step is for selecting a circuit structural component.

The binding step is for allocating a necessary hardware resource (circuit element like functional unit, register, and the like) to each process expressed in a behavior level description.

Another optimizing step is for executing a process like optimization of a data path.

The behavioral synthesis unit 31 stores an intermediate level description created in each step mentioned above in the intermediate level description storing area 25. The behavioral synthesis unit 31 eventually creates an RT level description through the foregoing individual steps, and stores the RT level description in the RT level description storing area 27.

The synthesis constraint creating unit 32 executes a process equivalent to a process executed in the foregoing language level optimizing step. The synthesis constraint creating unit 32 reads out a behavior level description optimized in a language level from the intermediate level description storing area 25, and analyzes it. Thereafter, the synthesis constraint creating unit 32 classifies processes, such as computation, inputting, and outputting included in the behavior level description with a process attribute, and acquires the emergence number of each process in the behavior level description for each process attribute. The synthesis constraint creating unit 32 stores the acquired emergence number for each process attribute ("emergence number for each classification" if needed) in the process emergence number storing area 26.

Furthermore, the synthesis constraint creating unit 32 creates synthesis constraint information by appropriately checking the emergence number for each classification stored in the process emergence number storing area 26, library information stored in the library storing area 22, and synthesis instruction information stored in the synthesis instruction storing area 23. The synthesis constraint creating unit 32 stores the created synthesis constraint information in the synthesis constraint storing area 24.

The synthesis constraint creating unit 32 functionally has a language level optimizing unit 33, a process emergence number acquiring unit 34, a circuit structural component specifying unit 35, and a synthesis constraint information creating unit 36.

The language level optimizing unit 33 optimizes a behavior level description in a language level. That is, the language level optimizing unit 33 executes a process equivalent to the process executed in the foregoing language level optimizing step.

The process emergence number acquiring unit 34 classifies a process described in a behavior level description in accordance with a process attribute, and acquires the emergence number of a process belonging to each process attribute in the behavior level description. That is, the process emergence number acquiring unit 34 analyzes an optimized behavior level description, and acquires an emergence number for each classification.

The circuit structural component specifying unit 35 specifies a kind of a circuit structural component, which can execute a process belonging to each process attribute and which can be described in a register transfer level description, for each process attribute based on library information specifying a circuit structural component which can be described in a register transfer level description.

The synthesis constraint information creating unit 36 creates synthesis constraint information which indicates the kind and number of a circuit structural component necessary to express a process described in a behavior level description in a register transfer level description based on the emergence number of a process acquired for each process attribute by the process emergence number acquiring unit 34, and the kind of the circuit structural component specified for each process attribute by the circuit structural component specifying unit 35.

Next, an explanation will be given of the synthesis constraint creating process by the behavioral synthesis device 100 having the foregoing structure. Let us suppose that a behavior level description, library information and synthesis instruction information are stored in the behavior level description storing area 21, the library storing area 22, and the synthesis instruction storing area 23, respectively, beforehand.

Figure 4:
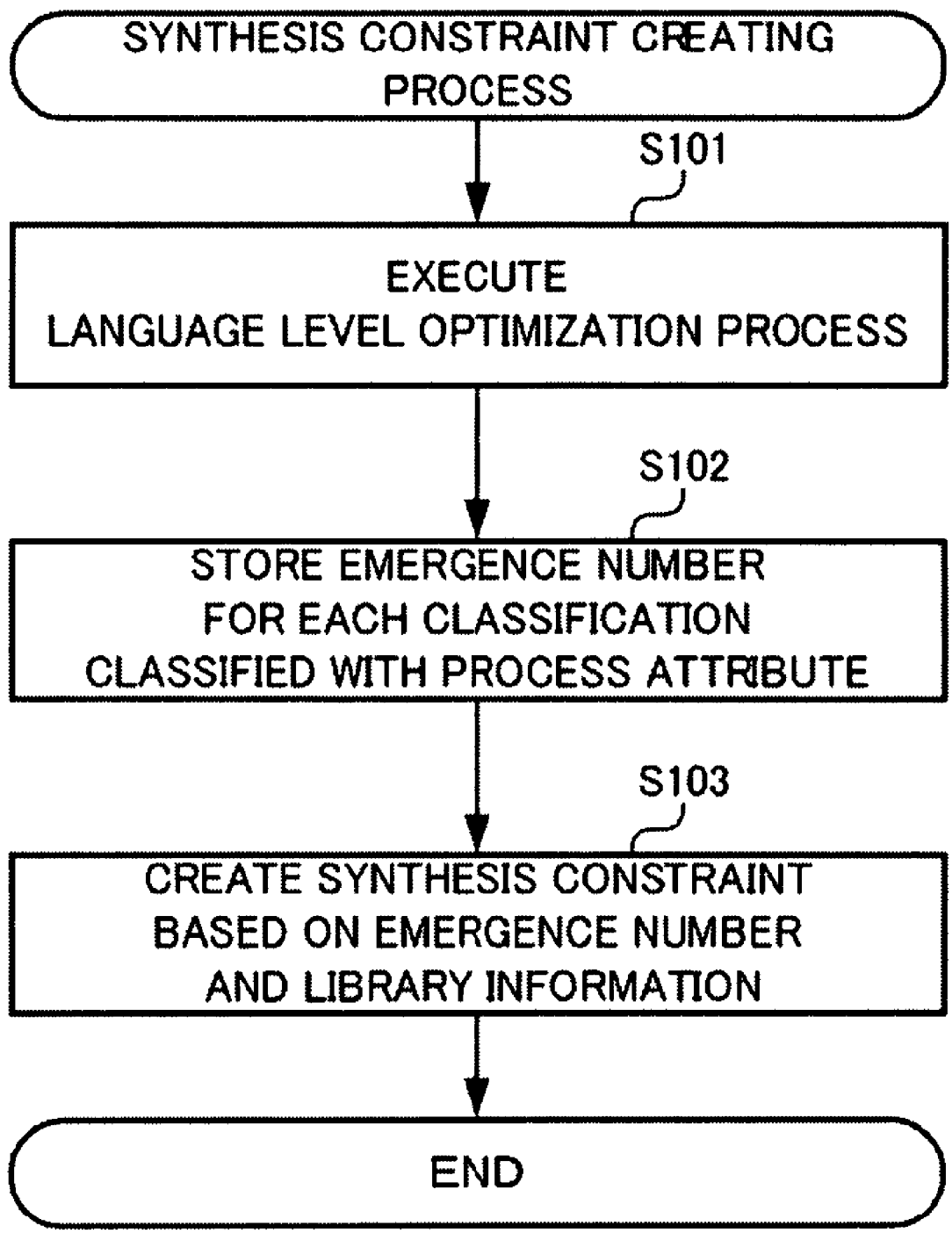
FIG. 4 is a flowchart for explaining a synthesis constraint creating process according to the first embodiment of the present invention.

As the user inputs an instruction for starting a synthesis constraint creating process through the input unit 10 of the behavioral synthesis device 100, in response to the inputting, the process unit 30 starts the synthesis constraint creating process shown in the flowchart of FIG. 4.

As the synthesis constraint creating process starts, first, the behavioral synthesis unit 31 of the process unit 30 executes a language level optimizing process (step S101). More specifically, the behavioral synthesis unit 31 reads out a behavior level description and synthesis instruction information stored in the behavior level description storing area 21 and the synthesis instruction storing area 23, respectively. Next, the behavioral synthesis unit 31 performs optimization on the behavior level description in a language level based on the read-out information. The behavioral synthesis unit 31 stores the optimized behavior level description in the intermediate level description storing area 25.

For example, when a process target in the step S101 is a behavior level description shown as a description 201 in FIG. 2, the behavior level description is optimized in a level of language in such a way that a behavior level description shown as a description 202 is to be created. In this example, a loop control statement A1 in the behavior level description is replaced with arithmetic process statements B1 to B4 that are expanded (unrolled) by what corresponds to the number of repeating of the loop.

Returning to FIG. 4, next, the synthesis constraint creating unit 32 stores an emergence number for each classification classified with a process attribute (step S102). More specifically, the synthesis constraint creating unit 32 reads out the behavior level description optimized in a language level from the intermediate level description storing area 25 and analyzes the behavior level description, and classifies a process included in the behavior level description with a process attribute. Thereafter, the synthesis constraint creating unit 32 acquires an emergence number in the behavior level description for each classification, and stores the acquired emergence number in the process emergence number storing area 26.

For example, let us consider a case where a behavior level description having undergone optimization shown as the description 202 in FIG. 2 is a target of the process in the step S102. In this case, processes corresponding to arithmetic process statements B1 to B4 are classified to one classification having process attributes of a process kind "addition", a bit width "8", and a sign "unsigned", and the emergence number in the behavior level description is specified as "4". Moreover, processes corresponding to arithmetic process statements B5 to B8 are classified individually as processes having process attributes of bit widths "4" to "7", and the emergence number for each classification is specified as "1". Information shown in the table 302 in FIG. 3 is overall stored in the process emergence number storing area 26.

Returning to FIG. 4, next, the synthesis constraint creating unit 32 acquires synthesis constraint information based on information stored in the process emergence number storing area 26 in the step S102 and the library information stored in the library storing area 22, and stores the acquired synthesis constraint information in the synthesis constraint storing area 24 (step S103). Note that the synthesis constraint information is the kind and number of minimum circuit structural components required to embody the processes in the behavior level description using the circuit structural components registered in the library information.

In the step S103, the synthesis constraint creating unit 32 may acquire the synthesis constraint information based on synthesis instruction information further. This makes it possible to reflect an instruction included in the synthesis instruction information and to be given to a whole synthesized circuit in the synthesis constraint information to be created, so that the precision of the synthesis constraint information increases.

When the process in the step S103 is completed, the synthesis constraint creating process is completed.

An explanation will be given of the specific example of the process of acquiring the foregoing synthesis constraint information (step S103) with reference to FIG. 3.

The table 301 shown in FIG. 3 exemplarily shows library information stored in the library storing area 22. The table 301 indicates that four kinds of adders having different bit widths are registered as library information.

The table 302 shown in FIG. 3 shows information stored in the process emergence number storing area 26. The table 302 indicates that there is one arithmetic process for addition processes having bit widths "4", "5", "6" and "7", and there are four arithmetic processes for an addition process having a bit width "8", and a total of eight arithmetic processes are included in the behavior level description shown as the description 202 in FIG. 2.

In this case, synthesis constraint information is acquired as follows. That is, an adder which has the most smallest bit width and which can embody an addition process of each bit width shown in the table 302 is selected by the emergence number of such an addition process from adders registered in the library. More specifically, one adder having a bit width "4" which is necessary to embody an addition process of a bit width "4" is selected. Likewise, two adders having a bit width "6" necessary to embody addition processes of bit widths "5" and "6" (one adder for an addition process of a bit width "5", and one adder for an addition process of a bit width "6") are selected. Likewise, five adders having a bit width "8" necessary to embody addition processes of bit widths "7" and "8" (one adder for an addition process of a bit width "7", and four adders for an addition process of a bit width "8") are selected. That is, synthesis constraint information exemplarily shown in a table 303 in FIG. 3 is created, and is stored in the synthesis constraint storing area 24.

Next, an explanation will be given of the specific example further using the synthesis instruction information in creation of synthesis constraint information (step S103) with reference to FIG. 5.

A table 501 in FIG. 5 exemplarily shows library information stored in the library storing area 22. As shown in the table 501, six kinds of functional units (adder, subtracter and adder-subtracter) having different bit widths and signs are registered.

A table 503 in FIG. 5 exemplarily shows information which is acquired by analyzing a behavior level description having undergone language-level optimization exemplarily shown in a table 502 in FIG. 5 and which is stored in the process emergence number storing area 26. In the example shown in the table 503, there are one addition process having a bit width "8" and a sign "unsigned", one addition process having a bit width "16" and a sign "unsigned", one subtraction process having a bit width "8" and a sign "unsigned", and one addition process having a bit width "16" and a sign "signed", and a total of four arithmetic process are included in the behavior level description.

It is generally known that there are differences in circuit areas to be created and delay times between a case where an addition process and a subtraction process are carried out using exclusive functional units (i.e., an addition process is executed by an adder and a subtraction process is executed by a subtracter) and a case where an addition process and a subtraction process are carried out using a functional unit (hereinafter, "adder-subtracter") which can be used for both addition and subtraction, as exemplarily shown in a table 601 in FIG. 6. That is, when an addition process and a subtraction process are carried out, a circuit can be realized with a smaller area if an adder-subtracter is used in comparison with a case where exclusive functional units are used, but a circuit having a larger delay time is realized in comparison with a case where exclusive functional units are used. For example, a circuit comprised of one adder-subtracter has a smaller area and a larger delay time in comparison with a circuit comprised of one adder and one subtracter.

It is also generally known that there are differences in circuit areas to be created and delay times between a case where arithmetic processes having signs "signed" and "unsigned" are carried out by using exclusive functional units (i.e., computing having a sign "signed" is executed by a functional unit which can cope with only a sign "signed" and computing having a sign "unsigned" is executed by a functional unit which can cope with only a sign "unsigned") and a case where arithmetic processes are carried out by using a functional unit which can cope with both signs "signed" and "unsigned" (hereinafter, "mixed-sign functional unit"), as exemplarily shown in a table 602 in FIG. 6. That is, when arithmetic processes having signs "signed" and "unsigned" are carried out, if a mixed-sign functional unit is used, a circuit having a smaller area can be realized in comparison with a case where exclusive functional units are used, but a circuit having a larger delay time is realized in comparison with a case where exclusive functional units are used. For example, a circuit comprised of one mixed-sign functional unit has a smaller area but has a larger delay time in comparison with a circuit comprised of one sign-present functional unit and one sign-absent functional unit.

In such a case, when information instructing to perform behavioral synthesis taking a priority to an "area" is included in synthesis instruction information, the behavioral synthesis unit 31 creates synthesis constraint information exemplarily shown in a table 504 in FIG. 5. That is, in functional units registered in the library, there are two kinds of functional units: an adder and an adder-subtracter having a bit width "8", which can embody an addition process having a bit width "8" exemplarily shown in the table 503 in FIG. 5 and which have the smallest bit width, but because the priority is given to an "area", the adder-subtracter having a bit width "8" is selected. Likewise, as a functional unit which can embody a subtraction process having a bit width "8", has the smallest bit width and can cope with an "area" prioritization, an adder-subtracter having a bit width "8" is selected. Likewise, as a functional unit which can embody an addition process having a bit width "16" and a sign "unsigned", has the smallest bit width and can cope with an "area" prioritization, an adder having a bit width "16" and signs "signed, unsigned" is selected. Likewise, as a functional unit which can embody an addition process having a bit width "16" and a sign "signed", has the smallest bit width and can cope with an "area" prioritization, an adder having a bit width "16" and signs "signed, unsigned" is selected.

In such a case, furthermore, when information instructing to perform behavioral synthesis taking a priority to a "delay time" is included in synthesis instruction information, the behavioral synthesis unit 31 creates synthesis constraint information exemplarily shown in a table 505 in FIG. 5. That is, in functional units registered in the library, there are two kinds of functional units: an adder and an adder-subtracter having a bit width "8", which can embody an addition process having a bit width "8" exemplarily shown in the table 503 in FIG. 5, and which have the smallest bit width, but because the priority is given to a "delay time", the adder having a bit width "8" is selected. Likewise, as a functional unit which can embody a subtraction process having a bit width "8", has the smallest bit width, and can cope with a "delay time" prioritization, a subtracter having a bit width "8" is selected. Likewise, as a functional unit which can embody an addition process having a bit width "16" and a sign "unsigned", has the smallest bit width and can cope with a "delay time" prioritization, an adder having a bit width "16" and a sign "unsigned" is selected. Likewise, as a functional unit which can embody an addition process having a bit width "16" and a sign "signed", has the smallest bit width and can cope with a "delay time" prioritization, an adder having a bit width "16" and a sign "signed" is selected.

As explained above, the behavioral synthesis device 100 of the first embodiment creates synthesis constraint information based on a behavior level description optimized in a language level and library information. By utilizing synthesis instruction information for creation of synthesis constraint information, it becomes possible to create synthesis constraint information having a higher precision and further matching what the circuit designer or the like intends.

The synthesis constraint creating unit 32 of the behavioral synthesis device 100 creates an RTL description based on the synthesis constraint information created in this fashion, in response to an instruction from the circuit designer or the like. Therefore, according to the embodiment, behavioral synthesis can be carried out without preparing synthesis constraint information beforehand.

Second Embodiment

In the foregoing embodiment, when synthesis constraint information is created, implementing method of the affiliation attribute of a process and an optimization method in a language level are not taken into consideration. In the second embodiment, however, synthesis constraint information is created in consideration of the affiliation attribute of a process and an optimization method in a language level, so that synthesis constraint information which further matches the requirement from a circuit designer can be created.

Figure 7:
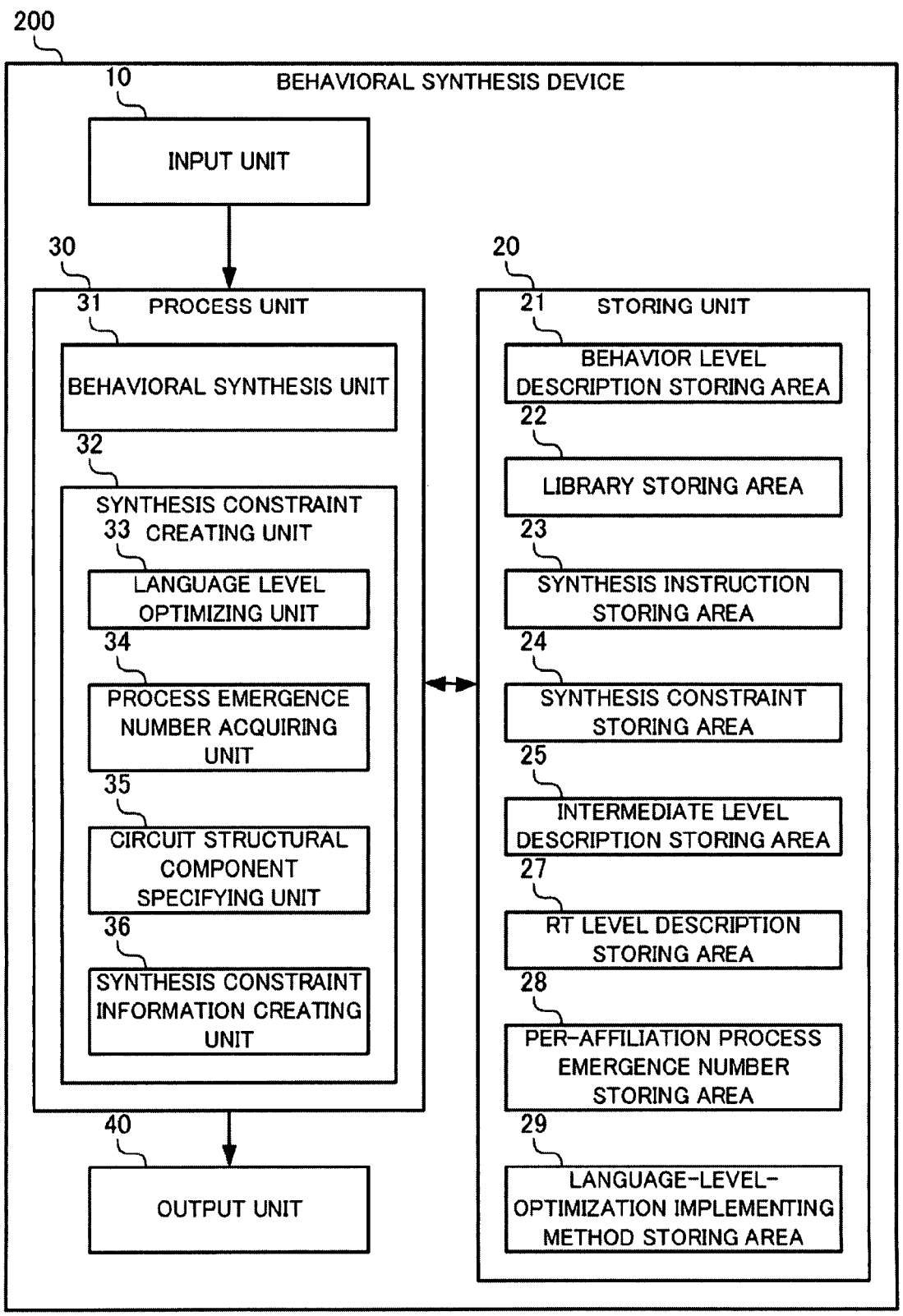
FIG. 7 is a block diagram showing the structure of a behavioral synthesis device according to the second embodiment of the present invention.

FIG. 7 shows a behavioral synthesis device 200 according to the second embodiment of the present invention. The behavioral synthesis device 200 of the second embodiment employs a structure that the process emergence number storing area 26 is deleted from the storing unit 20 of the behavioral synthesis device 100 shown in FIG. 1, and a per-affiliation process emergence number storing area 28 and a language-level-optimization implementing method storing area 29 are added.

The per-affiliation process emergence number storing area 28 stores an emergence number of a process in a behavior level description classified with the attribute of the process (hereinafter, "process attribute") and an affiliation attribute, for each classification.

Note that an affiliation attribute means information indicating what control block a process in a behavior level description affiliates. An affiliation attribute is information indicating, for example, whether the process affiliates the body of a loop control statement or in a function.

The language-level-optimization implementing method storing unit 29 stores information indicating an implementing method of optimization when the behavioral synthesis unit 31 optimizes a behavior level description in a language level. Examples of a general optimization implementing method in a language level are expansion of a loop control statement (unroll), and a resolution of a function calling (inline expansion), etc.

Figure 9:
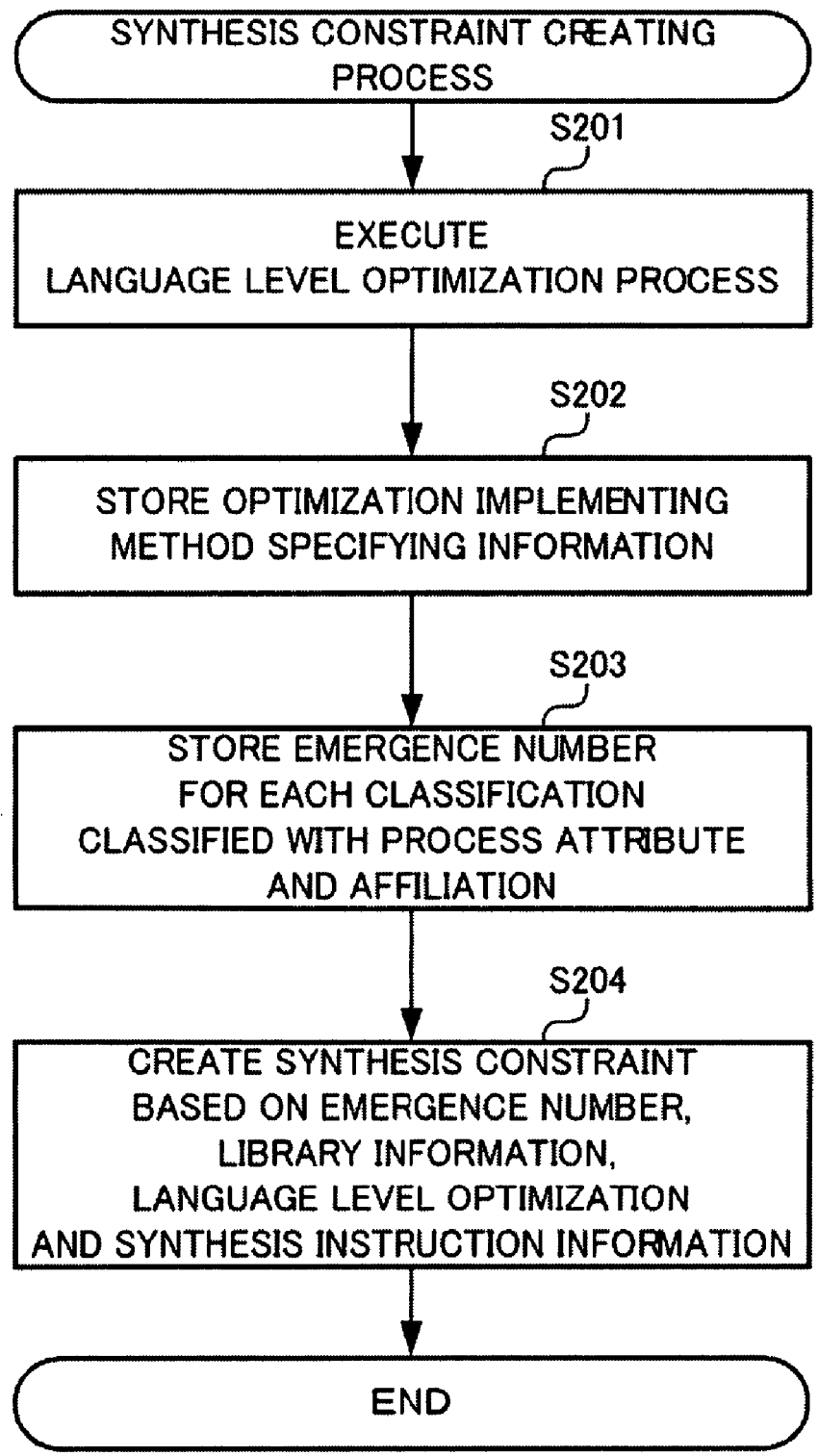
FIG. 9 is a flowchart for explaining a synthesis constraint creating process according to the second embodiment of the present invention.

Next, an explanation will be given of a synthesis constraint creating process by the behavioral synthesis device 200 having the foregoing structure, with reference to the flowchart of FIG. 9.

As the synthesis constraint creating process starts, the behavioral synthesis unit 31 of the process unit 30 of the behavioral synthesis device 200 optimizes a behavior level description in a language level, and stores the optimized behavior level description in the intermediate level description storing area 25 (step S201). This process is substantially equal to the process (step S101 in FIG. 4) of the behavioral synthesis device 100 of the first embodiment.

For example, when a behavior level description shown as a description 801 in FIG. 8 is a process target in the step S201, as is shown as a description 802 in FIG. 8, optimization in a language level is performed. In this example, a loop control statement C4 in the behavior level description is replaced with arithmetic process statements D4 to D7 which are expanded (unrolled) by what corresponds to the repeating number of the loop. Moreover, processes C2, C5 of calling a function are expanded as arithmetic process statements D2, D8 that the code of a function to be called is subjected to expansion (inline expansion).

Returning to FIG. 9, next, the behavioral synthesis unit 31 issues an ID to a portion where an implementing method is applied, for each kind of optimization implementing method, and stores the ID in the language-level-optimization implementing method storing area 29 in association with information for specifying the kind of the applied optimization implementing method (optimization implementing method specifying information) (step S202).

An explanation will be given of the specific example of the process in the step S202.

For example, let us suppose that a behavior level description shown as the description 801 in FIG. 8 is optimized in a language level as the description 802 in FIG. 8. The synthesis constraint creating unit 32 issues a common ID "01" to arithmetic process statements D4 to D7 that the loop control statement is unrolled. The synthesis constraint creating unit 32 stores the ID "01" in the language-level-optimization implementing method storing area 29 in association with optimization implementing method specifying information "unroll of a loop (repeating number: four)". Moreover, the synthesis constraint creating unit 32 issues a common ID "02" to the processes D2, D8 that a function is subjected to inline expansion. The synthesis constraint creating unit 32 stores the ID "02" in the language-level-optimization implementing method storing area 29 in association with optimization implementing method specifying information "function inline expansion (calling number: two)". As a whole, information shown in a table 1003 in FIG. 10 is stored in the language-level-optimization implementing method storing area 29.

Note that the process in the step S202 may be executed by the behavioral synthesis unit 31 in the process (step S201) of optimizing a behavior level description in a language level.

Returning to FIG. 9, next, the synthesis constraint creating unit 32 stores an emergence number classified with a process attribute and an affiliation attribute, for each classification (step S203). More specifically, the synthesis constraint creating unit 32 first reads out a behavior level description having undergone optimization in a language level from the intermediate level description storing area 25, and analyzes the behavior level description. Next, the synthesis constraint creating unit 32 classifies a process included in the behavior level description having undergone language level optimization with a process attribute. Further, the synthesis constraint creating unit 32 reads out a behavior level description prior to language level optimization from the behavior level description storing area 21, and analyzes the behavior level description. The synthesis constraint creating unit 32 determines the affiliation attribute of each process in the behavior level description prior to optimization, wherein each process included in the behavior level description having undergone language level optimization. The synthesis constraint creating unit 32 further classifies the process classified with the process attribute beforehand with an affiliation attribute. For each classification classified with a process attribute and an affiliation attribute in this fashion, the synthesis constraint creating unit 32 acquires the emergence number of each process in the behavior level description having undergone language level optimization, and stores the acquired emergence number in the per-affiliation process emergence number storing area 28 (step S203).

Note that the process in the step S203 may be executed by the behavioral synthesis unit 31 in the process (step S201) of optimizing a behavior level description in a language level.

Moreover, the process in the step S202 and the process in the step S203 may be carried out in an opposite order.

For example, let us suppose that a behavior level description having undergone optimization as shown as the description 802 in FIG. 8 is a target of the process in the step S203. In this case, arithmetic process statements D1 and D3 are classified to a process attribute having a process kind "addition", a bit width "4", and a sign "unsigned". The arithmetic process statements D1 and D3 correspond to arithmetic process statements C1 and C3 which do not belong to any process blocks like a loop in the behavior level description prior to optimization as shown as the description 801 in FIG. 8, so that the affiliation attributes thereof are classified as "nullity". Therefore, the emergence number of the classification including the arithmetic process statements D1 and D3 are specified as two. Moreover, arithmetic process statements D2 and D8 are classified to a process attribute having a process kind "subtraction", a bit width "4", and a sign "unsigned". The arithmetic process statements D2 and D8 correspond to function calling statements C2 and C5 in the behavior level description prior to optimization as shown as the description 801 in FIG. 8, so that the affiliation attributes thereof are classified as "function". Therefore, the emergence number of the classification including the arithmetic process statements D2 and D8 are specified as two. Furthermore, arithmetic process statements D4 to D7 are classified to a process attribute having a process kind "addition", a bit width "8", and a sign "unsigned". The arithmetic process statements D4 to D7 correspond to a loop control statement C4 in the behavior level description prior to optimization as shown as the description 801 in FIG. 8, so that the affiliation attribute thereof are classified as "loop". Therefore, the emergence number of the classification including the arithmetic process statements D4 to D7 is specified as four. As a whole, information exemplarily shown in a table 1002 in FIG. 10 is stored in the per-affiliation process emergence number storing area 28.

Returning to FIG. 9, next, the synthesis constraint creating unit 32 creates a synthesis constraint based on an emergence number, library information, language level optimization information, and synthesis instruction information (step S204). More specifically, based on optimization implementing method specifying information stored in the language-level-optimization implementing method storing area 29 in the step S202, information stored in the per-affiliation emergence number storing area 28 in the step S203, library information stored in the library storing area 22, and synthesis instruction information stored in the synthesis instruction storing area 23, the synthesis constraint creating unit 32 acquires the kind and number of circuit structural component as synthesis constraint information, and stores the acquired information in the synthesis constraint storing area 24. The kind and number of circuit structural component are acquired as minimum kind and minimum number required for embodying a process in a behavior level description using circuit structural components registered in the library information, and acquired in such a way that the kind of optimization indicated by the synthesis instruction information is reflected.

When the process in the step S204 is completed, the synthesis constraint creating process is also completed.

An explanation will be given of the specific example of the process of acquiring the synthesis constraint information (step S204) with reference to FIG. 10.

A table 1001 in FIG. 10 exemplarily shows library information stored in the library storing area 22. The table 1001 shows that three kinds of adders and a subtracter are registered as the library information.

A table 1002 in FIG. 10 exemplarily shows information stored in the per-affiliation process emergence number storing area 28. The table 1002 shows that there are two addition processes having an affiliation attribute "nullity", four addition processes having an affiliation attribute "loop", and two subtraction processes having an affiliation attribute "function", and a total of eight arithmetic processes are included in a behavior level description shown as the description 802 in FIG. 8.

A table 1003 in FIG. 10 exemplarily shows information stored in the language-level-optimization implementing method storing area 29. The table 1003 shows that a process specified with an ID "01" (processes D4 to D7 in a behavior level description shown as the description 802 in FIG. 8) is subjected to loop expansion (unroll) having the repeat number of four, and a process specified with an ID "02" (processes D2 and D8 in the behavior level description shown as the description 802 in FIG. 8) is subjected to inline expansion of a function having a calling time of two.

The synthesis instruction storing area 23 can store information indicating a priority rate between area prioritization synthesis and delay time prioritization synthesis for a behavioral synthesis process. In this example, the synthesis instruction storing area 23 stores information indicating "to perform behavioral synthesis so that the priority rate between area prioritization and delay time prioritization becomes 1:1". When performing behavioral synthesis, it is general that area prioritization and delay time prioritization are in an exclusive relationship. That is, it is general when behavioral synthesis is performed taking a priority to reducing the area of a circuit to be created, the delay time of the circuit to be created becomes large, and when behavioral synthesis is performed taking a priority to reducing a delay time of a circuit to be created, the area of the circuit to be created becomes large. Accordingly, the designer specifies that behavioral synthesis is carried out taking a priority to either one of an area and a delay time. Information indicating how much either one of an area and a delay time is prioritized in behavioral synthesis is stored beforehand as "information indicating a priority rate between area prioritization and delay time prioritization" in the synthesis instruction storing area 23. Note that when the priority rate between area prioritization and delay time prioritization is 1:1, behavioral synthesis is carried out while emphasizing reduction of an area and reduction of a delay time at an equal level.

In the example shown in FIG. 10, the synthesis constraint information is acquired as follows. First, let us focus the process having an ID "01", it becomes clear from the table 1002 and the table 1003 that this process has a repeat number of four, and there are four processes expanded by loop unrolling. When functional units (adders) are allocated to all four processes, i.e., when synthesis constrain information is created in such a way that four functional units are to be created, all of the four processes can be carried out using individual functional units simultaneously, so that the maximum parallelism can be accomplished. In this case, however, an area becomes large by what corresponds to four functional units. Conversely, when synthesis constraint information is created in such a way that one functional unit which is the minimum number for embodying the processes is to be created for the four processes, an area becomes the minimum area by what corresponds to one functional unit. In this case, however, it is necessary to successively execute the four processes by using one functional unit, a delay time becomes four times as much as that of the foregoing case where four functional units are used. In this case, hence the synthesis instruction information indicates that "the priority rate between area prioritization and delay time prioritization becomes 1:1 in behavioral synthesis", an intermediate case between a case where the delay time becomes minimum and a case where an area becomes minimum is taken on, and synthesis constraint information is created in such a way that two functional units (adders) are to be created to embody the four processes.

Likewise, let us focus the process having an ID "02", it becomes clear from the table 1002 and the table 1003 that this process has a calling number of two, and there are two processes subjected to inline expansion. In order to accomplish that "the priority rate between area prioritization and delay time prioritization becomes 1:1 in behavioral synthesis" indicated by the synthesis instruction information, synthesis constraint information is created in such a way that one (or two) functional unit (subtracter) is to be created to embody the process. When the number of functional unit is decided in consideration of the priority, when there are plural candidates for the number of functional unit (in the embodiment, one or two), the number of functional unit can be decided with reference to various conditions. For example, the number of functional unit can be decided in consideration of an affiliation attribute. More specifically, the larger number (in the embodiment, two) of functional unit is set for a case where an affiliation attribute is "nullity" or "function", and the smaller number (in the embodiment, one) of functional unit is set for a case where an affiliation attribute is "loop". The reason why the number of functional unit is set in this fashion will be explained below. That is, multiple processes belonging to a same affiliation attribute will often be processed collectively, while multiple processes belonging to different affiliation attributes will often be processed independently. For example, multiple processes existing within a function, and multiple processes existing within a loop would be processed in such a collective manner. In addition, the language-level optimization is performed affiliation attribute by affiliation attribute. Here, some method of optimization require determining a constraint number within a same affiliation attribute. Therefore, generating the synthesis constraint information by classifying the processes not only in view of the process attribute, but also in view of the affiliation attribute is likely to yield a synthesis constraint information that would be more appropriate for the intention of the designer than in the case in which no such classification based generation is carried out.

Regarding a process having an affiliation attribute "nullity", the correspondence emergence number is two as shown in the table 1002. In order to accomplish that "the priority rate between area prioritization and delay time prioritization becomes 1:1 in behavioral synthesis" indicated by the synthesis instruction information, synthesis constraint information is created in such a way that one (or two) functional unit (adder) is to be created to embody the process.

Briefly speaking, synthesis constraint information exemplarily shown in a table 1004 in FIG. 10 is eventually created, and is stored in the synthesis constraint storing area 24.

As explained above, according to the second embodiment, the behavioral synthesis device 200 creates synthesis constraint information in consideration of the affiliation attribute of a process and the implementing method of language level optimization. Accordingly, by performing behavioral synthesis using this synthesis constraint information, it is possible to create an RTL description having a further better circuit designing efficiency.

The present invention is not limited to the foregoing embodiments, and can be modified and changed in various forms.

For example, in the first and second embodiments, the process attributes of a functional unit which is a circuit structural component are a "process kind", a "bit width" and a "sign". The process attributes are, however, not limited to those, and if there is another attribute affecting creation of an RTL description (e.g., an area, delay time of a functional unit), the functional units may be classified using such an attribute, and the emergence number thereof may be acquired.

In the first and second embodiments, the explanation has been given of the method of creating synthesis constraint information taking the case where a circuit structural component is a functional unit as an example. However, the present invention can be applied to a case where a circuit structural component is a memory element like a register or an input/output terminal. In this case, it is necessary to classify the circuit structural component with a process attribute (e.g., a constituent bit number for a register) corresponding to the circuit structural component, and to acquire the emergence number thereof.

In the second embodiment, as shown in the table 1002 in FIG. 10, the explanation has been given of the case where the processes having the same process attribute have the same affiliation attribute. However, even if the process attribute is same, the processes may have different affiliation attributes. In this case, processes may be classified based on whether or not both process attribute and affiliation attribute are same, and the emergence number thereof may be acquired for each classification (for each process attribute and for each affiliation attribute). Then, for each classification, the number of functional unit is decided in consideration of a priority rate, an affiliation attribute and die like. Eventually, by summing up the number of functional unit acquired for classifications having the same process attribute but having different affiliation attributes, the number of functional unit for each process attribute may be acquired. Accordingly, the number of functional unit can be adjusted in consideration of an affiliation attribute.

In the foregoing language level optimization step, the explanation has been given of the case where inline expansion of a function and unrolling of a loop are inevitably executed. However, for example, when synthesis instruction information stored in the synthesis instruction storing area 23 indicates that a priority is given to an area, inline expansion of a function and unrolling of a loop may not be executed.

In the first and second embodiments, as a specific example of a behavior level description, behavior level descriptions described in System C are shown in FIGS. 2, 8 and the like, but is not limited to this language, and the present invention can be applied to a programming language like C language, and other behavior level descriptions like HDL (Hardware Description Language).

The behavioral synthesis device of the present invention may not be exclusive hardwares, and can be realized by using a general computer.

More specifically, in the foregoing embodiments, the explanation has been given of the case where the program of the behavioral synthesis device is stored in a memory or the like beforehand. However, a program to execute the foregoing processes may be stored in a computer-readable recording medium, such as a flexible disk, a CD-ROM (Compact Disk Read-Only Memory), a DVD (Digital Versatile Disk), or an MO (Magneto-Optical disk) for distribution, and may installed in a computer to constitute a program profiling device which executes the foregoing processes.

Moreover, such a program may be stored in the disk device or the like of a server device over a communication network like the Internet, and may be superimposed on a carrier wave so that a computer can download such a program. Further, the foregoing processes can be executed by activating and running such a program while transferring such a program via a communication network.

When the foregoing function is realized by an OS (Operating System) or by cooperation of the OS and an application, a portion other than the OS may be stored in a medium for distribution, and may be downloaded in a computer.

Various embodiments and changes may be made thereunto without departing from the broad spirit and scope of the invention. The above-described embodiments are intended to illustrate die present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

What is claimed is:

1. A synthesis constraint creating device that creates synthesis constraint information indicating a constraint which must be satisfied when a behavioral synthesis device creates a register transfer level description from a behavior level description, the synthesis constraint creating device comprising:
   a process emergence number acquiring unit that classifies a process described in the behavior level description in accordance with a process attribute, and acquires, for each process attribute, an emergence number indicating a number of times that a process belonging to each process attribute is described in the behavior level description;
   a circuit structural component specifying unit that specifies, for each process attribute, a kind of a circuit structural component which can embody a process belonging to each process attribute and which can be described in the register transfer level description based on library information for specifying circuit structural components which can be described in the register transfer level description; and
   a synthesis constraint information creating unit that creates synthesis constraint information indicating a kind and a number of a circuit structural component necessary for expressing a process described in the behavior level description by the register transfer level description based on the emergence number of a process acquired by the process emergence number acquiring unit for each process attribute, and the kind of a circuit structural component specified by the circuit structural component specifying unit for each process attribute wherein the emergence number of each process attribute is determined by dividing a number of units for the process belonging to the process attribute in a language level optimized version of the process by a number of units for the process in a non-language level optimized version of the process, the emergence number equal to a ratio of the number of units for the process in the language level optimized version of the process to the number of units for the process in the non-language level optimized version of the process.

2. The synthesis constraint creating unit according to claim 1, wherein the synthesis constraint information creating unit creates synthesis constraint information further based on synthesis instruction information instructing a synthesis scheme of behavioral synthesis.

3. The synthesis constraint creating device according to claim 2, wherein the synthesis instruction information includes either one of information to the effect that behavioral synthesis is carried out taking a priority to reducing an area of a circuit to be created, and information to the effect that behavioral synthesis is carried out taking a priority to reducing a delay time of the circuit to be created.

4. The synthesis constraint creating device according to claim 2, wherein the synthesis instruction information indicates a rate of priority indicating how much reduction of an area of the circuit to be created and reduction of a delay time thereof are prioritized in the behavioral synthesis.

5. The synthesis constraint creating device according to claim 1, further comprising a language level optimizing unit that optimizes the behavior level description in a language level, and wherein
   the process emergence number acquiring unit classifies, in accordance with a process attribute, a process described in a behavior level description having undergone optimization by the language level optimizing unit, and acquires, for each process attribute, the emergence number of a process belonging to each process attribute, the process being in the behavior level description having undergone optimization by the language level optimizing unit.

6. The synthesis constraint creating device according to claim 1, wherein:
   the process emergence number acquiring unit classifies a process described in the behavior level description in accordance with a process attribute and an affiliation attribute, and acquires, for each combination of a process attribute and an affiliation attribute, an emergence number of a process belonging to each process attribute and each affiliation attribute in the behavior level description;
   the circuit structural component specifying unit specifies, for each combination of a process attribute and an affiliation attribute, a kind of a circuit structural component which can embody a process belonging to each process attribute and each affiliation attribute and which can be described in the register transfer level description based on library information for specifying circuit structural components which can be described in the register transfer level description; and
   the synthesis constraint information creating unit creates synthesis constraint information indicating a kind and a number of a circuit structural component necessary for expressing a process described in the behavior level description in the register transfer level description based on the emergence number of a process acquired for each combination of a process attribute and an affiliation attribute by the process emergence number acquiring unit and a kind of a circuit structural component specified for each combination of a process attribute and an affiliation attribute by the circuit structural component specifying unit.

7. The synthesis constraint creating device according to claim 6, wherein the affiliation attribute of a process includes at least one of information indicating that a position of the process in the behavior level description is in a predetermined loop, information indicating that the position of the process in the behavior level description is in a predetermined function, and information indicating that the position of the process in the behavior level description is outside a function.

8. The synthesis constraint creating device according to claim 6, further comprising a language level optimizing unit that optimizes the behavior level description in a language level, and wherein:
the process emergence number acquiring unit classifies a process described in the behavior level description having undergone optimization by the language level optimizing unit in accordance with a process attribute and an affiliation attribute, and acquires, for each combination of a process attribute and an affiliation attribute, an emergence number of a process belonging to each process attribute and each affiliation attribute in the behavior level description having undergone optimization by the language level optimizing unit; and
the synthesis constraint information creating unit creates synthesis constraint information indicating a kind and a number of a circuit structural component necessary for expressing a process described in the behavior level description in the register transfer level description based on the emergence number of a process acquired for each combination of a process attribute and an affiliation attribute by the process emergence number acquiring unit, the kind of a circuit structural component specified for each combination of a process attribute and an affiliation attribute by the circuit structural component specifying unit, and information in which information indicating an implementing scheme of optimization by the language level optimizing unit and information for identifying a process in the behavior level description subjected to optimization through the implementing scheme are associated with each other.

9. The synthesis constraint creating device according to claim 1, wherein the circuit structural component includes at least one of a computing element, a memory element, an input element, and an output element.

10. A behavioral synthesis device comprising:
a process emergence number acquiring unit that classifies a process described in a behavior level description in accordance with a process attribute, and acquires, for each process attribute, an emergence number indicating a number of times that a process belonging to each process attribute is described in the behavior level description;
a circuit structural component specifying unit that specifies, for each process attribute, a kind of a circuit structural component which can embody a process belonging to each process attribute and which can be described in a register transfer level description based on library information for specifying circuit structural component which can be described in the register transfer level description;
a synthesis constraint information creating unit that creates synthesis constraint information indicating a kind and a number of a circuit structural component necessary for expressing a process described in the behavior level description by the register transfer level description based on the emergence number of a process acquired for each process attribute by the process emergence number acquiring unit and the kind of a circuit structural component specified for each process attribute by the circuit structural component specifying unit; and
a behavioral synthesis unit that creates the register transfer level description from the behavior level description with a constraint indicated by the synthesis constraint information created by the synthesis constraint information creating unit being satisfied wherein the emergence number of each process attribute is determined by dividing a number of units for the process belonging to the process attribute in a language level optimized version of the process by a number of units for the process in a non-language level optimized version of the process, the emergence number equal to a ratio of the number of units for the process in the language level optimized version of the process to the number of units for the process in the non-language level optimized version of the process.

11. A synthesis constraint creating method executed by a synthesis constraint creating device that creates synthesis constraint information indicating a constraint which must be satisfied when a behavioral synthesis device creates a register transfer level description from a behavior level description, the device comprising a process emergence number acquiring unit, a circuit structural component specifying unit, and a synthesis constraint information creating unit, and the method comprising:
a process emergence number acquiring step in which the process emergence number acquiring unit classifies a process described in the behavior level description in accordance with a process attribute, and acquires, for each process attribute, an emergence number indicating a number of times that a process belonging to each process attribute is described in the behavior level description;
a circuit structural component specifying step in which the circuit structural component specifying unit specifies, for each process attribute, a kind of a circuit structural component which can embody a process belonging to each process attribute and which can be described in the register transfer level description based on library information for specifying circuit structural components which can be described in the register transfer level description; and
a synthesis constraint information creating step in which the synthesis constraint information creating unit creates synthesis constraint information indicating a kind and a number of a circuit structural component necessary for expressing a process described in the behavior level description by the register transfer level description based on the emergence number of a process acquired by the process emergence number acquiring unit for each process attribute, and the kind of a circuit structural component specified by the circuit structural component specifying unit for each process attribute wherein the emergence number of each process attribute is determined by dividing a number of units for the process belonging to the process attribute in a language level optimized version of the process by a number of units for the process in a non-language level optimized version of the process, the emergence number equal to a ratio of the number of units for the process in the language level optimized version of the process to the number of units for the process in the non-language level optimized version of the process.

12. A non-transitory storage device recording a program allowing a computer to function as a synthesis constraint creating device that creates synthesis constraint information indicating a constraint which must be satisfied when a behavioral synthesis device creates a register transfer level description from a behavior level description, and wherein the synthesis constraint creating device comprising:

a process emergence number acquiring unit that classifies a process described in the behavior level description in accordance with a process attribute, and acquires, for each process attribute, an emergence number indicating a number of times that a process belonging to each process attribute is described in the behavior level description;

a circuit structural component specifying unit that specifies, for each process attribute, a kind of a circuit structural component which can embody a process belonging to each process attribute and which can be described in the register transfer level description based on library information for specifying circuit structural components which can be described in the register transfer level description; and a synthesis constraint information creating unit that creates synthesis constraint information indicating a kind and a number of a circuit structural component necessary for expressing a process described in the behavior level description in the register transfer level description based on the emergence number of a process acquired by the process emergence number acquiring unit for each process attribute, and the kind of a circuit structural component specified by the circuit structural component specifying unit for each process attribute wherein the emergence number of each process attribute is determined by dividing a number of units for the process belonging to the process attribute in a language level optimized version of the process by a number of units for the process in a non-language level optimized version of the process, the emergence number equal to a ratio of the number of units for the process in the language level optimized version of the process to the number of units for the process in the non-language level optimized version of the process.

* * * * *